United States Patent
Potter et al.

(10) Patent No.: US 6,275,841 B1
(45) Date of Patent: Aug. 14, 2001

(54) 1-OF-4 MULTIPLIER

(75) Inventors: Terence M. Potter; James S. Blomgren; Anthony M. Petro, all of Austin, TX (US)

(73) Assignee: Intrinsity, Inc., Austin, TX (US)

( * ) Notice: Subject to any disclaimer, the term of this patent is extended or adjusted under 35 U.S.C. 154(b) by 0 days.

(21) Appl. No.: 09/186,843

(22) Filed: Nov. 5, 1998

Related U.S. Application Data (60) Provisional application No. 60/069,250, filed on Dec. 11, 1997.

(51) Int. Cl.[7] ........................................ G06F 7/50
(52) U.S. Cl. .................................................. 708/620
(58) Field of Search ............................... 708/628–632, 708/620, 623

(56) References Cited

U.S. PATENT DOCUMENTS

| | | | |
|---|---|---|---|
| 4,965,762 | * 10/1990 | Williams | 708/631 |
| 4,972,362 | * 11/1990 | Elkind et al. | 708/632 |
| 5,150,322 | * 9/1992 | Smith et al. | 708/631 |
| 5,208,489 | 5/1993 | Houston . | |
| 5,208,490 | 5/1993 | Yetter . | |
| 5,424,734 | 6/1995 | Hirahara et al. . | |
| 5,524,088 | 6/1996 | Yoshida . | |
| 5,640,108 | 6/1997 | Miller . | |
| 5,668,525 | 9/1997 | Chiu et al. . | |
| 5,740,094 | * 4/1998 | Klim | 708/620 |
| 5,748,517 | * 5/1998 | Miyoshi et al. | 708/630 |
| 5,870,322 | * 2/1999 | Kim | 708/631 |
| 5,935,202 | * 8/1999 | Frederick, Jr. | 708/630 |

* cited by examiner

Primary Examiner—David H. Malzahn
(74) Attorney, Agent, or Firm—Booth & Wright, L.L.P.; Matthew J. Booth; Karen S. Wright (57) ABSTRACT

The described multiplier provides the signed or unsigned product of a multiplicand and multiplier represented in preferably 1-of-4 N-NARY signals by performing a preferably radix-four Booth recoding of the multiplier, producing partial products using a plurality of Booth multiplexers, summing the partial productsto produce two intermediate partial products using a six-level Wallace tree, and summing the two intermediate partial products using a carry lookahead adder. The Booth encoding is performed at the dit level using encoding circuitry implemented in N-NARY logic.

24 Claims, 8 Drawing Sheets

```
                                    Sss bbbb bbbb bbbb bbbb bb i
                                    1Sbb bbbb bbbb bbbb bbbb bb i
                                         1S bbbb bbbb bbbb bbbb bbbb bb i
                                         1Sbb bbbb bbbb bbbb bbbb bbbb i
                                         1S bbbb bbbb bbbb bbbb bbbb bb i
                                              1Sbb bbbb bbbb bbbb bbbb bb i
                                              1S bbbb bbbb bbbb bbbb bbbb i
                                              1Sbb bbbb bbbb bbbb bbbb bb i
                                                   1S bbbb bbbb bbbb bbbb bb i
                                                   1Sbb bbbb bbbb bbbb bbbb i
                                                   1S bbbb bbbb bbbb bbbb bb i
                                                        1Sbb bbbb bbbb bbbb bb i
                                                        1S bbbb bbbb bbbb bbbb i
                                                        1Sbb bbbb bbbb bbbb bb i
                                                             1S bbbb bbbb bbbb bb i
                                                             1Sbb bbbb bbbb bbbb i
                                                             1S bbbb bbbb bbbb bb i
```

1-OF-4 MULTIPLIER

This application claims the benefits of the earlier filed U.S. Provisional Application Ser. No. 60/069250, filed Dec. 11, 1997, which is incorporated by reference for all purposes into this application. This application is also related to U.S. patent application Ser. No. 09/206,539, entitled "Method and Apparatus for a 1 of 4 Shifter," filed on Dec. 7, 1998 (07.12.1998), assigned to Intrinsity, Inc. (formerly EVSX, Inc.) now abandoned.

BACKGROUND OF THE INVENTION

1. Field of the Invention

The present invention relates to computer architecture, and more specifically to arithmetic operations with a digital computer.

2. Description of the Related Art

The speed of computer systems has exploded in recent years. Processor designs have become more efficient, and smaller substrate feature sizes and improved designs have allowed the achievement of speeds than had been thought impossible only a few years previously. However, the computer industry continues to drive toward even greater speeds in the future.

Early generations of logic circuit families of bipolar transistors, P-channel field effect transistors (PFETs or p-channel devices), and N-channel field effect transistors (NFETs or n-channel devices), have given way to processor designs using a logic circuit family known as CMOS (Complementary Metal Oxide Semiconductor). A traditional CMOS logicgate consists of a pair of complementary transistors where one transistor is a P-channel field effect transistor and the other transistor is a N-channel field effect transistor.

CMOS gained rapid favor for its ease of construction and simple design rules as well as its tolerance for noise and low power consumption. Power consumption in CMOS occurs only during the switching of the FETs. As a result of its wide popularity, most manufacturing capacity and design research investment in the last several years went into CMOS, which eventually overtook the other types of logic circuit families in nearly every category. Today, most people regard CMOS as the clear winner and preferred choice for virtually every semiconductor logic design task.

The advantage of the CMOS logic family, that it consumes power only when the FETs are switching, was limited to the older circuits that were slow by today's standards, and has become its primary disadvantage as clock rates have increased. The drive for faster dock rates means that the same CMOS circuit that used so little power in the past now requires ever increasing power. Typical CMOS processor designs have been known to consume power in the neighborhood of 50 watts or more. Such power demands (and their related heat dissipation problems) make designing computer systems very difficult.

Another logic family, non-inverting dynamic logic (also called domino logic, or asymmetrical CMOS), has lent itself to very high clock rates. Circuits within the nor-inverting dynamic logic have typically implemented each signal as a pair of wires or datapaths, providing all information in both true and complemented form. Twice as many wires or datapaths have been required as in a similar traditional CMOS design, because dynamic logic generally has not allowed inverted signals. Boolean AND, NAND, OR, NOR, and other well-known functions have been implemented in non-inverting dynamic logic using typical CMOS gates with nor-inverted signals. For example, U.S. Pat. No. 5,208,490 to Yetter et al and U.S. Pat. No. 5,640,108 to Miller describe methods for improving the speed and or accuracy (deglitching) of dynamic logic circuits. However, the power consumption of the logic family remains problematic.

Synthesized multiplication implemented through repeated addition is extremely slow; for a 32-bit multiplication, 32 adds and 32 shifts would be required. Multicycle partial multipliers, which implement hardware to perform a portion of the multiplication (for example, 32 times 8 bits) in a single cycle, have improved multiplication latency dramatically, but typically have not been able to be pipelined, since all the hardware must be used in four successive cycles to produce a full product. Full multipliers, containing hardware sufficient to compute a full product (64 bits, following the 32-bit example), have been implemented to ii avoid recycling results, and consequently have improved multiplication throughput (that is, number of results produced per cycle), albeit atthe expense of additional hardware cost. The superior performance of full multipliers has made these devices a common implementation choice for contemporary microprocessors. The additional hardware cost of a full multiplier has been mitigated somewhat by shrinking device sizes and larger transistor budgets.

SUMMARY OF THE INVENTION

The present invention includes a family of N-NARY logic circuits, including a low-power high-speed full multiplier circuit that not only reduces the number of partial products through Booth encoding, but does so according to the number system in which the operands are encoded. Specifically, according to one aspect of the invention, the multiplier circuit receives operands encoded in a base-four numbering system and implements a radix-four Booth encoding. Moreover, the multiplier circuit is implemented using a new logic family, the N-NARY logic family, providing extremely fast calculations at very low power.

The present invention additionally comprises a method and apparatus for an integrated circuit (IC) that uses 1 of N signals to reduce both the circuit's power consumption and the circuit's wire-to-wire effective capacitance. Each of the 1 of N signals (also called "N-NARY signals") of the N-NARY logic family of the present invention has a set of N wires or logic paths, of which at most one of the N logic paths belonging to each signal is active during an evaluation cycle. Various logic signals, including multiple signals of different widths, may be included within the N-NARY logic family. According toone aspect, the N-NARY logic family of the present invention implements a two bit logic circuit that uses "1 of 4" signals, each signal having a set of four wires (also called logic paths), of which one and only one of the four logic paths belonging to each signal is active during an evaluation cycle. Other embodiments of the present invention include the use of a 1 of 2 signal, a 1 of 3 signal, a 1 of 4 signal, and a 1 of 8 signal where one and only one of the wires of the signal is active. The "width" of the signals refers to the number of wires used to implement the signals, and may be regarded as a numerical base in a base-N numbering system. For example, 1 of 4 signals may be regarded as implementing numerical values in a base-four number system.

In addition to N-NARY signals, the N-NARY logic family of the present invention also includes N-NARY logic circuit designs. N-NARY logic circuits include a logic tree circuit that couples to various input logic paths and at least one set of output logic paths, which all use N-NARY signals, for example 1 of 4 signals. The logic tree circuit uses a single, shared logic tree with multiple evaluation paths for evaluating the function of the logic circuit.

According to one aspect, the device of the present invention further comprises a precharge circuit that precharges the transistors in the logic tree circuit and an evaluate circuit that controls the logic tree circuit's evaluation where both couple to the logic tree circuit. And finally, a clock signal couples to the precharge circuit and the evaluate circuit.

The present invention also includes an N-NARY logic approach to multiplication of numbers within a processor. According to one aspect, the present invention includes a multiplier comprising several radix4 Booth encoders, Booth multiplexers, and a Wallace tree of carry-save-adders implemented using N-NARY logic gates and N-NARY logic signals in a high-speed yet simple design.

The multiplier of the described embodiment implements a radix-4 Booth algorithm to encode the second (i.e., the multiplier) value. Conveniently, according to the exemplary aspect to the present invention, the radix of the Booth algorithm corresponds to the width of the signals used to implement the various numbers and values to be multiplied.

The step of multiplexing, however, is performed after a step of receiving an asserted evaluate signal. Prior to receiving the asserted evaluate signal, a step of providing a null output is substituted for the step of multiplexing. The step of providing a null output includes a step of configuring a corresponding one of the 1-of-N signals representing the arithmetic product of the first and second values into a null state. Once the step of receiving the asserted evaluate signal is completed, the step of multiplexing is performed, including the step of providing a group of 1-of-N signals representing the arithmetic product of the first and second values into a state representing the partial product.

DETAILED DESCRIPTION OF THE INVENTION

Figure 1:
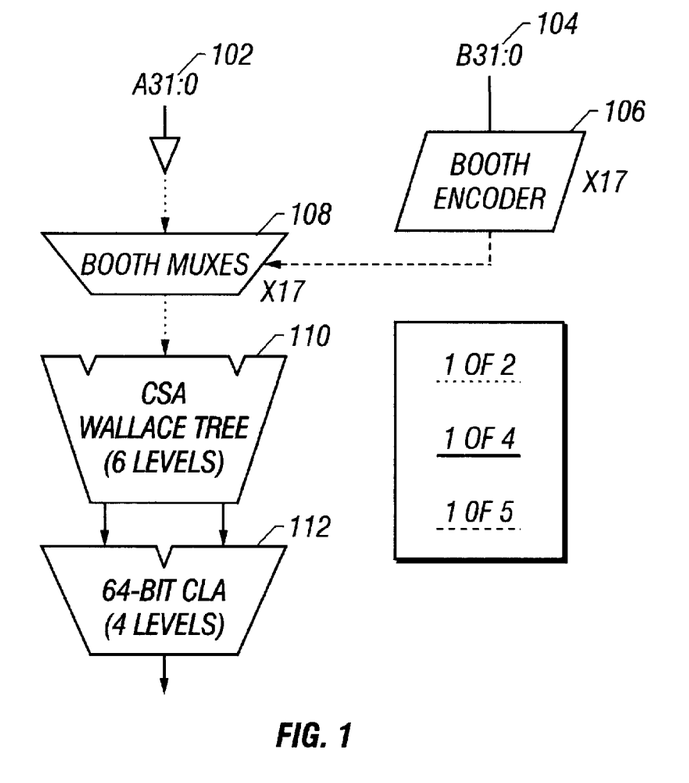
FIG. 1 shows a high-level view of a 32-bit signed/unsigned multiplier with 1-of-4 encoded data inputs and outputs.
Figure 3:
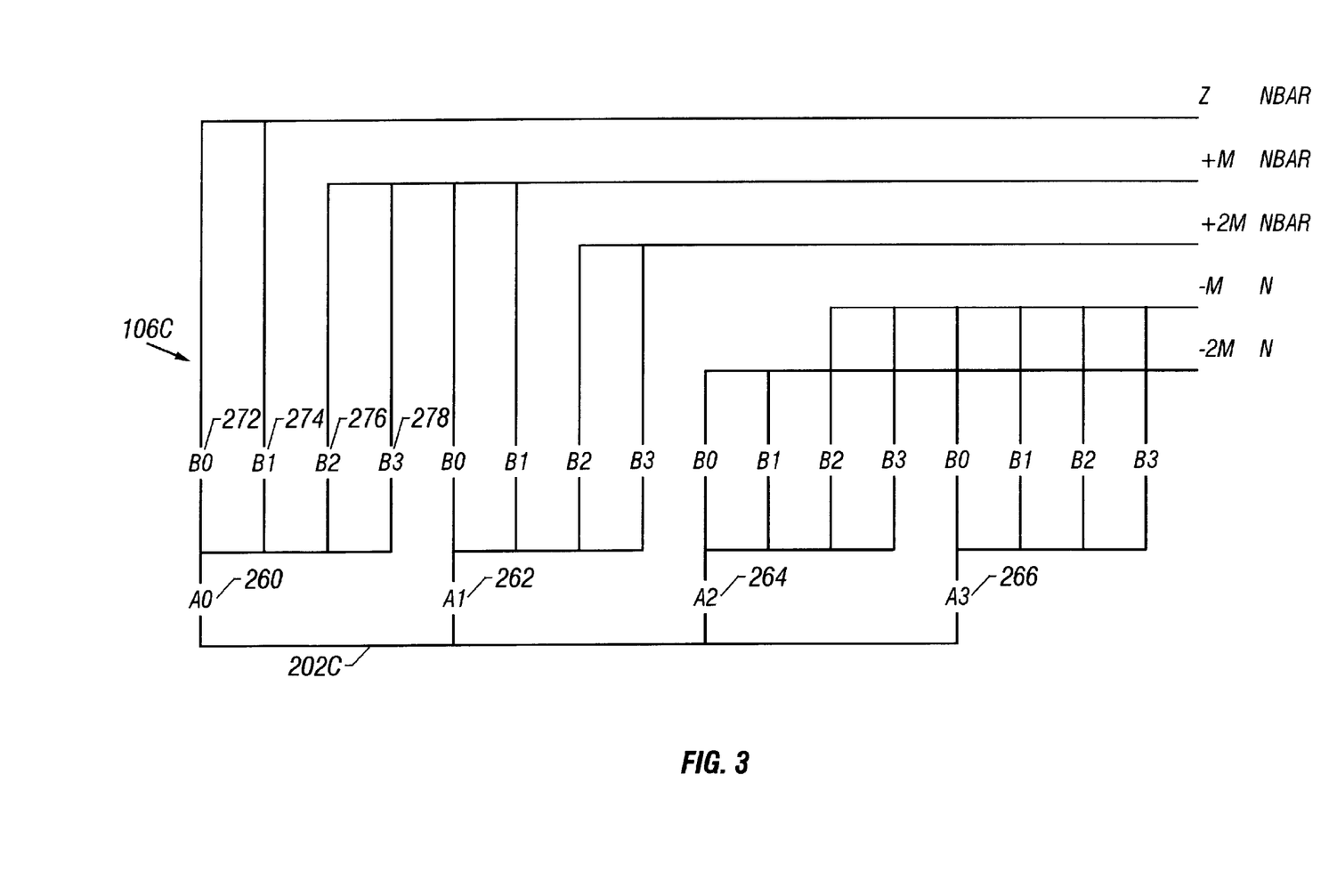
FIG. 3 shows a Booth encoder according to the exemplary embodiment of the present invention.
Figure 4:
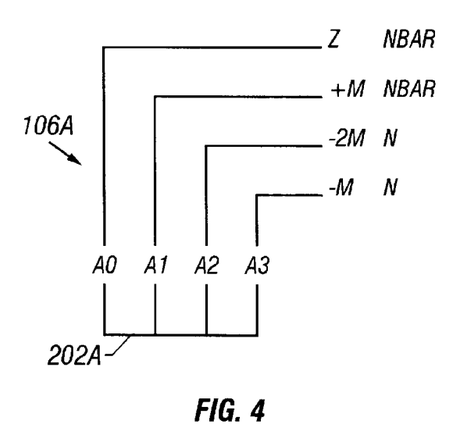
FIG. 4 shows the lowest-order Booth encoder according to the exemplary embodiment of the present invention.
Figure 5:
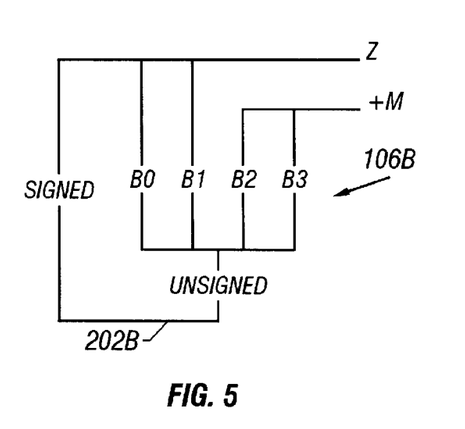
FIG. 5 shows the highest-order Booth encoder, according to the exemplary embodiment of the present invention.

Referring now to FIG. 1, a high-level view of a 32-bit signed/unsigned multiplier with 1-of-4 encoded data inputs and outputs is shown. The A operand 102 functions as the multiplicand, and is converted to 1-of-2 encoding while the B operand 104, as multiplier, passes through a set of Booth encoders 106 (FIGS. 3–5). The Booth encoders 106 produce a set of 1-of-5 mux controls representing the five possible partial product selections for a given position. It will be understood that the term "multiplier" in this context refers to the numerical value, not to the circuit as a whole.

The mux controls are provided to a set of seventeen Booth multiplexers (muxes) 108, each of which also receives the A operand (i.e., the multiplicand) and produces a 32-bit (16 dit) output. The outputs of the Booth muxes 108 (FIGS. 6–8) are combined into a six-level Wallace tree structure (FIG. 9) of Carry-Save-Adders (CSA's) 110. Conversion of the multiplicand to 1-of-2 encoding (FIG. 2) before providing the multiplicand to the Booth multiplexers results in a simpler CSA structure, due to the high degree to which intermediate sums cross odd bit boundaries in the Wallace tree. The results of the Wallace tree are finally added in a 64-bit four level carry-lookahead adder 112.

The preferred embodiment of the invention uses N-NARY logic as disclosed in copending application, U.S. patent application Ser. No. 09/019244, filed Feb. 5, 1998, now U.S. Pat. No. 6,069,497, entitled "Method and Apparatus for a N-NARY Logic Circuit Using 1of N Signals," which is incorporated by reference into this application.

The multiplier of the exemplary embodiments of the present invention is constructed of N-NARY logic gates, and is designed to operate on NNARY signals. Consequently, the multiplier of the exemplary embodiments of the present invention belongs to the N-NARY logic family.

A feature of the N-NARY logic style is that the switching speed of the gates is often closely related to the height of the n-tree which forms the logic function being implemented. Thus, stack height is an important variable that the designer can use to tune his/her design's performance. For example, one embodiment of the present invention uses no more than 4 transistors in an evaluation path (between the precharge circuit and the evaluate circuit), while another embodiment of the present invention uses no more than 3 transistors in an evaluation path. Other embodiments of the present invention allow for greater stack heights in the evaluation path. The maximum stack height of this embodiment of the present invention is 3 transistors in 3-input CSAs (not counting evaluate/precharge devices) and up to 4 transistors in the final carry-propagate adder.

The N-NARY logic family may be regarded as an extension of the dual rail non-inverting dynamic logic, with additional features. Non-inverting dynamic logic (also called domino logic, or asymmetrical CMOS), has typically implemented each signal as a pair of wires or datapaths, providing all information in both true and complemented form, requiring twice as many wires or datapaths as in a similar traditional CMOS design, because dynamic logic generally has not allowed inverted signals.

However, the speed increases achievable by converting from ordinary CMOS to dual rail non-inverting dynamic logic are accompanied by increases in power consumption. Both the redundant representation of data for dual rail nor-inverting dynamic logic and its increased switch factor increase the power consumption of logic circuits using this design style because there are more evaluation paths to evaluate and more transistors (overall) that are switching.

The N-NARY logic family achieves greater speed while containing power consumption through the use of N-NARY signals and N-NARY logic gates. A logic circuit consumes power when conducting current either directly from the power pins to the ground pins or when charging or discharging a capacitor (within the circuit). Most power consumed within a circuit, however, comes from the charging/discharging of the capacitors. A capacitor in a logic circuit occurs due to the inherent or intrinsic physical properties of the circuit that includes the metal wires that are within the circuit itself (i.e., inside the transistors) and the wires in-between the transistors.

Metal wires have capacitance that is a function of their length, dimensional cross section and their proximity to neighboring wires, while the capacitance of transistors is a function of their size. In other words, a logic circuit will consume more power if the circuit contains bigger transistors and or contains more wires or greater lengths of wire. With an increased number of wires and transistors necessary to implement dual-rail non-inverting dynamic logic, this logic family therefore has a high power consumption to offset its speed advantages. Since at most one wire in an N-NARY signal will evaluate during any evaluate cycle, N-NARY logic gates will charge and discharge fewer wires and switch fewer transistors than dual-rail dynamic logic, which requires 1 wire per bit to switch every cycle. Thus N-NARY power consumption will be less than that of dual-rail dynamic logic.

The N-NARY logic family, implemented when N=4, is referred to as a 1-of-4 logicfamily. Circuits belonging to the 1-of-4 logic family toggle between several states according to a precharge or clock signal. One state is a precharge state, in which evaluate nodes are precharged to Vdd. Another state is an evaluation state, in which at most one wire corresponding to each signal is active. The precharge state and evaluation state each have a corresponding portion of each clock cycle. The portion of each clock cycle corresponding to the precharge state is referred to as a precharge cycle, and the portion of each clock cycle corresponding to the evaluation state is referred to as an evaluation cycle.

Circuits belonging to the 1-of-4 logic family route 2 bits of information in a semiconductor device using a 1 of 4 signal. The 1 of 4 signal is implemented by four wires in a semiconductor device. At most one wire of the four wires is active during the evaluation cycle, and each active wire represents 2 bits worth of information.

Although described in terms of 1-of-4 encoding, other embodiments of present invention include the use of 1 of 2 signals with 1 of 2 encoding, 1 of 3 signals with 1 of 3 encoding, 1 of 8 signals with 1 of 8 encoding, and the general embodiment of 1 of N signals with 1 of N encoding. The logic tree circuit uses a single, shared logic tree with multiple evaluation paths for evaluating the function of the logic circuit. The device of the present invention further comprises a precharge circuit that precharges the transistors in the logic tree circuit and an evaluate circuit that controls the logic tree circuit's evaluation where both couple to the logic tree circuit. And finally, a clock signal couples to the precharge circuit and the evaluate circuit.

Background of Booth Encoding: The Booth Encoder

It is known that a 32-bit full multiplier (producing a 64-bit result) for unsigned numbers may be designed by simply replicating the multiplicand 32 times to form 32 partial products, offsetting each partial product by one bit with the first partial product aligned with the LSB, and gating each partial product with the appropriate bit of the multiplier term so that only products specified by the multiplier factor into the final product. The resulting array of 32 partial products (some of which are zeroed out) can then be sent to a tree of carry-save-adders (CSAS) for reduction to a pair of product terms that can then be added by a fast adder (typically a carry-lookahead adder, or CLA).

This approach has certain shortcomings, however. Reducing 32 partial products to two partial products requires eight levels of 3:2 CSAS, in addition to the level required to gate the partial products with the multiplier bits. A considerable number of CSAs (approximately 1000) are also required to reduce the absolute number of bits in the partial product array. Most significantly, however, this approach cannot efficiently deal with signed operands. To accommodate signed multiplication, separate logic would be required to convert signed operands to unsigned operands and complement the unsigned result if it were negative.

One common technique for building a signed multiplier is to employ a radix-4 Booth recoding of the multiplier. Instead of considering the multiplier bits one at a time when forming partial products from the multiplicand, multiplier bits are considered in pairs along with a trailing bit. Instead of merely adding or zeroing the multiplicand as the partial product, five choices for the partial product are possible as a function of the multiplier bits, as shown in Table 1.

In the binary number system, numbers are represented as strings of ones and zeros. From any such number, a "two's complement" may be calculated. When the original number contains a string of several consecutive ones, the two's complement contains a string of zeros preceded by a sign extended bit of one. Therefore, any number consisting of a string of ones may be written as a difference between two numbers, each having only a single one: a minuend, having one more digit than the original number and equaling the original number incremented by one, and a subtrahend, which is the two's complement of the original number. The minuend and the subtrahend each have only a single one-bit, all other bits being zero. The value of the resulting subtraction may be written as a difference between powers of two.

In binary multiplication, in which a multiplicand is multiplied by a multiplier, each bit of the multiplier is considered, and used to generate a partial product. The partial product, when only a single bit of the multiplier is considered, is either equal to the full multiplicand itself or to zero, shifted by the location of the multiplier bit within the multiplier. Therefore, each bit of the multiplier contributes a partial product. When the multiplier contains 32 bits, the multiplication produces 32 partial products. The partial products are then added to calculate the result of the multiplication.

The partial product, when only a single bit of the multiplier is considered, is either equal to the full multiplicand itself or to zero, shifted by the location of the multiplier bit within the multiplier. The number of nonzero partial products is therefore equal to the number of 1's in the multiplier. The Booth algorithm, as it has been commonly understood, allows a reduction in the number of partial products that must be produced by augmenting the ordinary binary number system and reducing the number of 1's in the multiplier, before actually performing the multiplication.

As described above, in the binary numbering system, any number that can be written as a string of consecutive 1's can also be expressed as the difference between powers of two. For example, the number 15 (decimal) can be written as 1111b, which is the difference between 16 and 1 (i.e., between 2^4 and 2^0). Rewriting, or "recoding," 1111b as "10000b−0001b" is a recoding that reduces the number of 1s. In the vocabulary of the Booth algorithm, "10000b−0001b" is written as 1000$\underline{1}$b, where $\underline{1}$b is a notational augmentation of the ordinary binary numbering system indicating a negative contribution. According to this notation augmentation of the ordinary binary numbering system, 01b+01b=0b, and 01b+10b=1b.

According to the Booth recoding, any string of consecutive 1's is recoded as a 100 . . . 01b, regardless of the length of the string of 1's. Therefore, all the Booth algorithm requires is that the ends of such strings of ones within the multiplier be located. The least significant bit of the string of 1's is recoded as a 1b, the next more significant bit to the most significant bit of the string of 1's is recoded as a 1b, and all the intervening bits are recoded as a 0b.

The Booth recoding is useful to reduce the number of nonzero bits in the multiplier, which can be beneficial in variable-latency multipliers since they typically only consider nonzero partial products. However, variable-latency multipliers are difficult to implement, and a more typical approach is to generate the partial products in parallel. When multiple operations are processed in parallel, it is the parallel operation that has the worst-case latency that dictates the overall latency of the entire operation. Therefore, reducing the number of parallel operations can potentially reduce the overall latency of the entire operation. One way to reduce the number of partial products, and thus the number of parallel operations, is to utilize a higher-radix Booth recoding technique. The radix of the Booth encoder controls the number of bits considered simultaneously. For example, a Booth algorithm that performs a radix-two Booth recoding considers bits in pairs.

The Booth algorithm allows each bit of a multiplier to be considered in parallel with the other bits, to determine whether the particular bit is at the end of a string of 1's. Various radices of the Booth algorithm are known. Each considers one or more recodable bits, and a "trailing" bit that is not recodable.

In a radix-two Booth recoding, each bit is considered to belong to two bit-pairs. Each pair of bits is examined in order to determine whether that pair represents the end of a string of 1's. When the bit pair is 10b, i.e. at the least significant end of the string of 1's, the Booth recoding replaces the 1b with a 1b. When the bit pair is 01b, i.e. at the most significant end of the string of 1's, the 1b is replaced with a 0b, and the next higher bit is recoded from a 0b to a 1b, yielding a 10b. Pairsofzeros (notwithin a string of 1's) are left in place, and pairs of ones (within a string of 1's but not at either end of the string) are recoded to 00b (a pair of zeros).

In a radix-two Booth algorithm, however, the trailing bit (i.e., the less significant bit of each bit-pair) cannot be recoded. In each bit pair, the more significant bit is recodable, and the less significant bit is a trailing bit and is not recodable. Thus, only one bit is produced for each bit pair, corresponding to the moresignificant bit of the bit pair. Consequently, the radix-two Booth algorithm examines each bit twice—once when it is the LSB of a bit pair, and again when it is the MSB of the next overlapping bit pair. Each pair of bits is examined in order to determine whether that pair represents the end of a string of 1's.

For example, when the bit pair is 10b, i.e. at the least significant end of the string of 1's, the Booth algorithm replaces the 1b with a 1b, yielding 1×b. When the bit pair is 01b, i.e. at the most significant end of the string of 1's, the 0b is recoded to a 1b, yielding a 1×b. Pairs of zeros (not within a string of 1's) are left in place as 0×b, and pairs of ones (within a string of 1's but not at either end of the string) are recoded to 0×b (a pair of zeros). Since only the more significant of the two bits considered at any time may be changed, the radix-two Booth algorithm is able to recode only one bit at a time. The algorithm examines as many bit pairs as there are number of bits in the multiplier.

While the radix-two Booth algorithm provides a reduction in the number of nonzero partial products, the overall number of partial products remains the same as the non-Booth-encoded case, because, although the multiplier operand has been recoded, the number of bits in the multiplier operand has not been reduced. Therefore, the overall latency of a multiplier apparatus that includes zero partial products is not likely to be significantly reduced by employing a radix-two Booth algorithm, since all partial products must still be generated—even though more partial products will be zero-and then summed. This is not the case with a radix-four Booth algorithm, however, which is why a radix-four Booth algorithm is used in the exemplary embodiment of the present invention.

The radix-four Booth algorithm retains the ease of 2-complementing found in the radix-two Booth algorithm. However, the radix-four Booth algorithm provides many benefits over both the Radix-two algorithm and the full multipliers that do not use the Booth algorithm at all. The most important of these benefits is the reduction in the number of partial products. In fact, a multiplier that uses the radix-four Booth algorithm produces half as many partial products as multipliers that use the radix-two algorithm and full multipliers that do not use the Booth algorithm at all.

Moreover, on a conceptual level, the radix-four Booth algorithm is more appropriate when the value of the multiplier to be encoded is already encoded in a base-four numbering system. The multiplier circuit of the present invention encodes N-NARY signals as 1 of 4 signals, each representing two bits of data. This encoding provides a conceptual framework for understanding the Booth encoders.

The Booth algorithm steps from the LSD (least significant dit) to the MSD (most significant dit) looking for opportunities to make this transformation. The trailing bit is used to establish a trend.

TABLE 1

Booth-recoded partial product selection

| 1-of-4 input to this Encoder | copy of dit to previous Encoder | (implicit input) Bn (This Encoder) | Bn-1 | recoding Bn-2 (Previous Encoder) | explanation (Booth Encoder Output) | (Two's complement) | Partial Product (Booth Mux Output) |
|---|---|---|---|---|---|---|---|
| 0 | 0 or 1 | 0 | 0 | 0 | 00 | Zero is its own two's complement. | zero |
| 0 | 2 or 3 | 0 | 0 | 1 | 01 | Two's complementing carries into this dit. | +M |
| 1 | 0 or 1 | 0 | 1 | 0 | 01 | No complementing necessary. | +M |
| 1 | 2 or 3 | 0 | 1 | 1 | 10 | Two's complement carries into higher bit. | +2M |
| 2 | 0 or 1 | 1 | 0 | 0 | 10 | 2's complement keeps a 1 in the higher bit | −2M |

TABLE 1-continued

Booth-recoded partial product selection

| 1-of-4 input | copy of dit to | (implicit input) | | recoding Bn-2 | explanation (Booth | | Partial Product |
|---|---|---|---|---|---|---|---|
| to this Encoder | previous Encoder | Bn (This Encoder) | Bn-1 (Previous Encoder) | (Previous Encoder) | Encoder Output) | (Two's complement) | (Booth Mux Output) |
| 2 | 2 or 3 | 1 | 0 | 1 | 01 | 2's complement reverses bit values | −M |
| 3 | 0 or 1 | 1 | 1 | 0 | 01 | 2's complement keeps a 1 in the lower bit | −M |
| 3 | 2 or 3 | 1 | 1 | 1 | 00 | Middle of string of 1's, 2's complement | zero |

Implementation of the Booth Encoders

The multiplier of the exemplary embodiment of the present invention includes seventeen Booth encoders, operating in parallel. The least-significant Booth encoder receives the least-significant two bits of the multiplier, and synthesizes a 0b as a trailing bit. The 0b corresponds to a 0b that is implied by a radix point (decimal point). It will be recalled that in any numbering system, an integer may be arbitrarily extended with no change in the value signified by the appending of a radix point and a sequence of zeros following the radix point. The simplified (degenerate) Booth encoder is shown in FIG. 4.

Although the above explanation of the Booth algorithm describes the multiplier as a sequence of bits, the present invention actually implements the Booth algorithm by regarding the multiplier as a sequence of dits (not bits). The least-significant two bits of the multiplier may be regarded as the least-significant dit of the multiplier, conceptually corresponding to the base-four numbering system implicit in 1 of 4 signals. Additionally, the Booth encoders of the exemplary embodiment of the present invention may be understood as an implementation of the radix-4 Booth algorithm, in which an implicit conversion is made between bits and 1-of-4 logic signals.

Referring now to FIG. 4, the lowest-order Booth encoder 106a (Booth encoder 0) is shown. The Booth encoder 106a has a 1-of-4 input that receives the lowest order dit of the multiplier value. When the lowest order dit of the multiplier has a value of 0 (corresponding to a 00b), the Booth encoder produces an output of Z. When the lowest order dit of the multiplier has a value of 1 (01b, corresponding to an isolated 1), the Booth encoder produces a value of +M (corresponding to 01b). When the lowest order dit of the multiplier has a value of 2 (10b, corresponding to the least-significant end of a string of 1's), the Booth encoder produces an output of −2M (corresponding to $1\underline{0}$b). When the lowest order dit of the multiplier has a value of 3 (corresponding to 11b), the Booth encoder produces an output of −M (corresponding to $0\underline{1}$b).

Referring now to FIG. 3, the Booth encoders used for dits 1 to 15 are shown. Each of these Booth encoders is a full radix-four Booth encoder, requiring three consecutive bits to recode, per Table 1. Physically, each receives a corresponding 1-of-4 signal (designated as signal A in FIG. 3), and a copy of the 1-of-4 signal input to the immediately less-significant Booth encoder (designated as signal B in FIG. 3). Conceptually, however, each receives a corresponding dit of the multiplier, implemented in a base-four numbering system. The relationship between the physical implementation of the Booth algorithm and the conceptual description of the multiplier value adds to the symmetry of the present invention.

Unlike the Booth encoder 0 of FIG. 4, the trailing bit for the Booth encoders 1–15 of FIG. 3 need not be identically zero. Consequently, the more significant one bit of the immediately less significant dit is provided as a trailing bit, and the less significant one bit of the immediately less significant dit is ignored. As shown in FIG. 3, this is performed by tying together state pairs of the trailing dit. The lowest order bit of the two dits is ignored by tying together B0 and B1, and the trailing bit is considered by tying together B2 and B3. FIG. 3 is an implementation of Table 1.

Each Booth encoder according to FIG. 3 produces a 1-of-5 result. The implementation of the 1-of-5 signal illustrates another advantage of the N-NARY logic family. The representation of the 1-of-5 signal has a different width than the 1-of-4 signals provided to the Booth encoders, yet both are easily configurable in the logic circuit.

Although the 32-bit multiplier has only sixteen dits, a seventeenth Booth encoder is provided. The seventeenth Booth encoder is shown in FIG. 5, and is a degenerate case of the Booth encoder of FIG. 4. Referring now to FIG. 5, the highest-order Booth encoder 106b (Booth encoder 16) is shown. The Booth encoder 106b of FIG. 5 also receives a 1-of-2 indicator of whether the multiplication is signed or unsigned. The seventeenth Booth encoder re-examines the highest order bit of the multiplier, which it receives as a trailing bit. The seventeenth Booth encoder then determines whether the highest order bit of the multiplier might be a sign bit, and whether sign-or-zero extension of the multiplier is to be inferred.

The distinction between signed and unsigned multiplication is only relevant when the most significant bit of the multiplier is a 1, since regardless of whether multiplication is unsigned or signed, a zero in the most significant bit means the same. In signed multiplication, sign-extension requires prepending by adding 1's. The first 1 means the number is negative, and the other prepending ones will be complemented to zeros.

Within the seventeenth Booth encoder shown in FIG. 5, an appropriate value is prepended to the most significant bit of the sixteer-dit multiplier. The appropriate value is selected according to whether the multiplication is signed or unsigned. To comply with the radix requirements (this is a radix-four Booth algorithm), the appropriate value includes two prepended bits. (The reason has nothing to do with the logic style). The multiplier is extended to the left by two bits (due to the radix number of the Booth encoder).

In the case of signed multiplication, these prepended bits are identical to the original sign bit.

| original sign bit | sign-extended sign bit |
|---|---|
| 0 => | 000 |
| 1 => | 111 |

After sign extending, it becomes apparent that both 000 and 111 encode to 00b, per Table 1. This is reflected in FIG. 5, in which the seventeenth Booth encoder under signed multiplication provides an output of Z.

In the unsigned case, zeros are prepended to (1) extend the number of bits without altering the value and (2) provide Booth encoding.

x→00x.

As shown in the first two rows of Table 1, however, 001b and 000b encode to different values. These two values are reproduced in Table 2.

TABLE 2

| prepended zeros ($B_n B_{n-1}$) | MSB ($B_{n-2}$) | Booth encoding |
|---|---|---|
| 00 | 0 => | $^+0$ |
| 00 | 1 => | $^+M$ |

Once the appropriate values are prepended, Booth encoding ensues. The highest order Booth encoder is thus a prepending-and-recoding logic cell that accounts for signed multiplication by conceptually prepending the appropriate value dit and then recoding. As shown in FIG. 5, the output of the prepending-and recoding Booth encoder is Z in the case of signed multiplication and in the case of unsigned multiplication where the highest order dit of the multiplier has a value of 0 or 1. Unsigned multiplication where the highest order dit of the multiplier has a value of 2 or 3 produces an output of $^+M$ in the prepending—and recoding Booth encoder 106b. If the multiplication is signed, the multiplier will be sign-extended by two bits, resulting in a pattern of 000 or 111; both patterns select zero. If the multiplication is unsigned, the multiplier will be zero-extended by two bits, resulting in a pattern of 000 or 001; the former selects zero while the latter selects +M. For all remaining cases (except the least significant dit—Booth encoder 0), all five possible Booth encodings are detected.

The Translation Buffer

Figure 2:
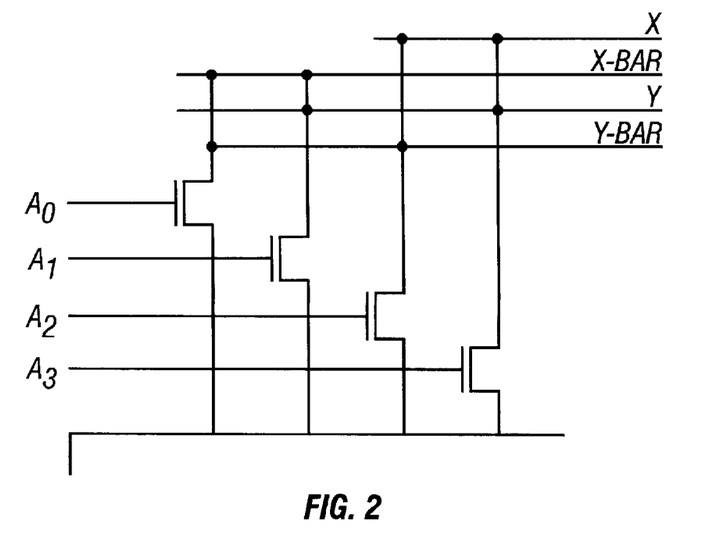
FIG. 2 shows a circuit for connecting two 1-of-2 signals to 1-of-4 signal.

In parallel with the Booth encoder's operations on the multiplier, each of the multiplicand dits is converted into a pair of 1-of-2 multiplicand bit-pairs, via a translation buffer shown in FIG. 2. The gate used to transform the multiplicand from 1-of-4 to 1-of-2 encoding is shown in FIG. 2. It takes a single 1-of-4 dit as an input and produces two 1-of-2 encoded bits as outputs. In parallel with this transformation, the Booth mux selects are derived by the Booth encoder logic, shown in FIGS. 3–5.

The Booth Multiplexers

The multiplier circuit of the exemplary embodiment to the present invention also includes seventeen Booth multiplexers, numbered 0–16. Each of the Booth multiplexers is connected to exactly one of the Booth encoders. Each of the Booth multi plexers is connected to receive both the 1-of-5 signal from the corresponding Booth encoder and the multiplicand, and produces a partial product. Each partial product is shifted with respect to the other partial products produced by the 16 other Booth multiplexers, according to the index of the particular Booth multiplexer.

The Booth multiplexers, however, do not share the same symmetry as the Booth encoders. Each Booth multiplexer contains a number of booth multiplexer cells. The number of Booth multiplexer cells depends on the size of the multiplicand. The first Booth multiplexer contains M+3 (where M represents the number of multiplicand bits) Booth multiplexer cells, and each other Booth multiplexer contains M+1. For a 32-bit (16-dit) multiplicand, the first Booth multiplexer contains 35 Booth multiplexer cells, numbered 0–34, and each other Booth multiplexer contains 33 Booth multiplexer cells, numbered 0–32.

Figure 6:
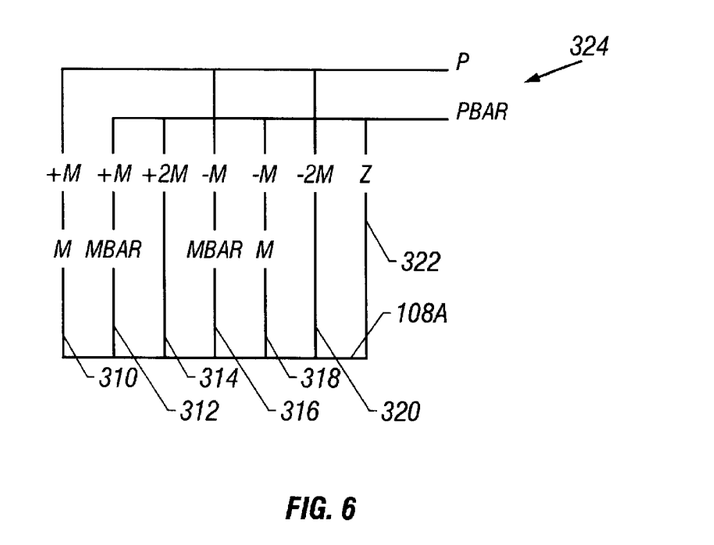
FIG. 6 shows the lowest-order Booth multiplexer (mux) according to the exemplary embodiment of the present invention.

Within each Booth multiplexer, there are three types of Booth multiplexer cells. Each Booth multiplexer has exactly one Booth multiplexer cell 108a according to the first type as shown in FIG. 6, corresponding to the least significant bit of the multiplicand. Within each Booth multiplexer, the Booth multiplexer cell of the first type is Booth multiplexer cell 0.

Figure 8:
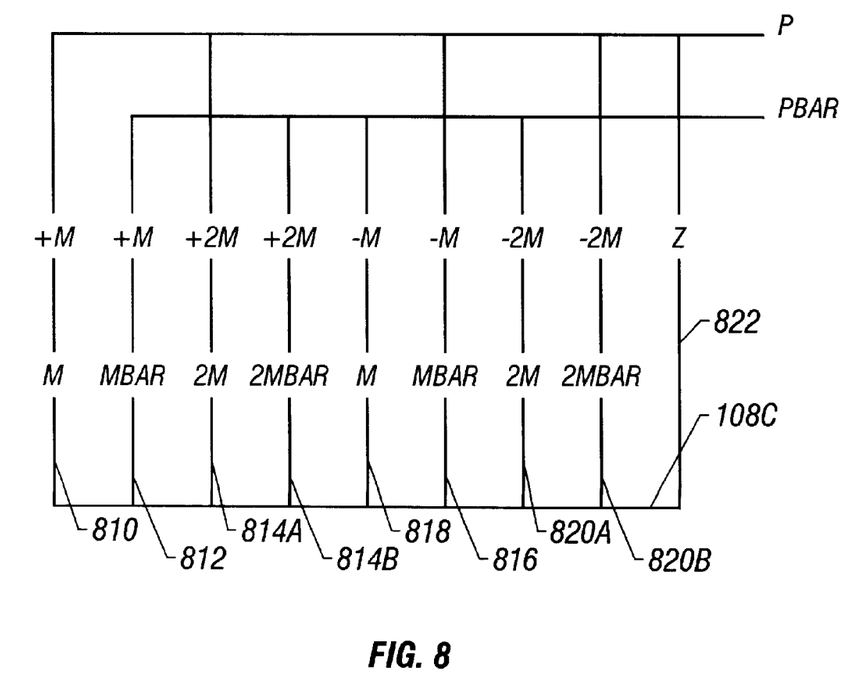
FIG. 8 shows the remaining Booth multiplexers (muxes) according to the exemplary embodiment of the present invention.

Each Booth multiplexer (other than the first, which has 33) also has 31 Booth multiplexer cells 108c according to the second type as shown in FIG. 8, each receiving a distinct bit of the multiplicand other than the least significant and also receiving the immediately less significant bit of the multiplicand as well. Within each Booth multiplexer, the Booth multiplexer cells of the second type are Booth multiplexer cells 1–31. (1–33 in the first Booth multiplexer.)

Figure 7:
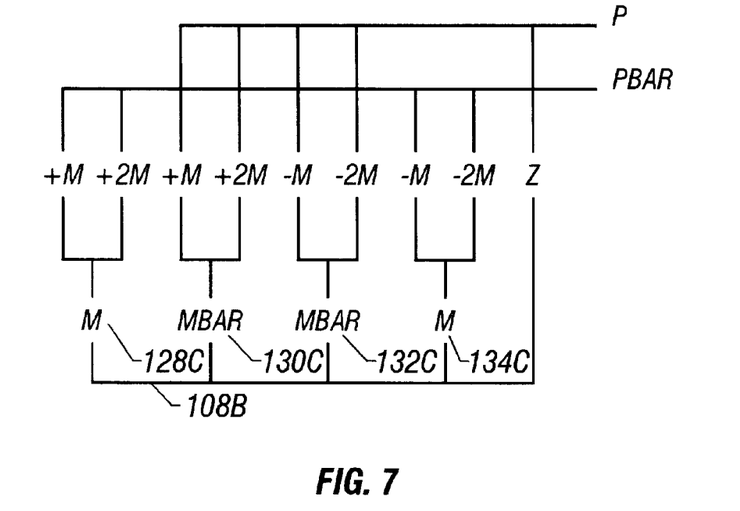
FIG. 7 shows the highest-order Booth multiplexer (mux) according to the exemplary embodiment of the present invention.

Each Booth multiplexer also has exactly one Booth multiplexer cell 108b according to ii the third type as shown in FIG. 7, corresponding to the sign bit (the most significant bit) of the multiplicand. Within the first Booth multiplexer, the Booth multiplexer cell of the third type is Booth multiplexer cell 34. Within Booth multiplexers other than the first, the Booth multiplexer cells of the third type are Booth multiplexer cells 32.

Reference is now made to FIGS. 6–8. Each Booth multiplexer cell 108a according to the first type as shown in FIG. 6 receives a pair of wires from the translation buffer (FIG. 2), implementing a 1-of-2 signal representing the least significant bit of the multiplicand. Each Booth multiplexer cell 108b according to the second type as shown in FIG. 8 receives four wires from the translation buffer (FIG. 2), implementing two 1-of-2 signals representing two adjacent bits of the multiplicand. Each Booth multiplexer cell 108c according to the third type as shown in FIG. 7 receives a pair of wires from the translation buffer (FIG. 2), implementing a 1-of-2 signal representing the sign bit of the multiplicand.

Each of the three types of Booth muffiplexer cells performs 3 suboperations, according to the 1-of-5 signal received from its corresponding Booth encoder cells:

1. Booth MUX shifting: shifting is used to generate the values 2M.
2. Booth MUX signing: the two's complement of M is used to generate the values −M and −2M.
3. Sign extension: the partial products are sign-extended.

Before discussing the suboperations in detail, we review two concepts in binary mathematics. The first is that of two's complement number representation. Two's complement numbers are signed integers which range from $-2^{n-1}$ to $2^{n-1}-1$, where n is the number of bits used to represent the number. Zero is represented with binary zero (as with unsigned integers), and the positive numbers are similarly represented as they would be for unsigned integers. Negative numbers are represented as $2^{n-1}+i$ (where i is the number being represented). Thus the 32-bit two's complement representation of −1 is ($2^{32}+(-1)$) or 0xffffffff.

In order to negate a two's complement number, we can invert the bits of the number and add 1. Thus the negation of −1 as a 32-bit two's complement number would be (0x00000000+1=0x00000001), and negating that gives (0xfffffffe+1=0xffffffff).

If we wish to multiply a two's complement number by two, we can simply shift the number left by 1bit, in the same way that multiplying a decimal number by ten can be accomplished by shifting the number left by a tens-place.

Each Booth MUX receives a 1-of-5 control signal which indicates that the partial product should be one of M, 2M, or zero.

Referring to FIG. 6, the Booth multiplexer cell 108a uses the 1-of-5 control signal along with the least significant bit of the multiplicand from the translation buffer (FIG. 2) to form the least significant bit of the partial product.

If the 1-of-5 control signal indicates that the partial product should be zero (Z), then the Pbar node is discharged through path 322 and P is not discharged.

If the 1-of-5 control signal indicates that the partial product should be M (M), then depending on the value of M, either node P is discharged through path 310 (M= =1), or node Pbar is discharged through path 312 (Mbar= =1). Thus this bit of P will be equal to M.

If the 1-of-5 control signal indicates that the partial product should be −M (−M), then depending on the value of M, either node P is discharged through path 316 (Mbar= =1), or node Pbar is discharged through path 318 (M= =1). Thus this bit of P will be equal to the inversion of M. Note that to get −M (in two's complement form), we must add 1 into this partial product. In the preferred embodiment, the present invention adds 1 to the appropriate inverted partial product by setting an "i" bit, aligned with the LSB of the appropriate inverted partial product. These "i" bits are then summed, along with the partial products, using a Wallace tree structure, as explained below. Conceptually, the present invention thus converts inverted partial products to the proper twos complement number while summing all partial products, to reach a mathematically correct result. The potential setting and alignment of the "i" bit for each partial product is shown in the bit structure created by the Booth multiplexers shown in FIG. 9.

Returning to FIG. 6, if the 1-of-5 control signal indicates that the partial product should be 2M (2M), then node Pbar is discharged through path 314. This sets the least significant bit of the partial product to zero, and represents shifting left by 1 bit-position to obtain 2M (a zero is shifted in).

If the 1-of 5 control signal indicates that the partial product should be −2M (−2M), then node P is discharged through path 320. This sets the least significant bit of the partial product to one, a nd represents shifting left by 1bit-position to obtain 2M (a zero is shifted in), and then inverting. Note that to get −2M (in two's complement form), we must add 1 into this partial product by setting and aligning the "i" bit for this partial product, as explained above.

Referring to FIG. 8, the Booth multiplexer cell 108c uses the 1-of-5 control signal along with 2 adjacent bits of the multiplicand from the translation buffer (FIG. 2) to form the remaining bits of the partial product The more significant bit of the multiplicand is represented by M and Mbar, while the less significant is represented by 2M and 2Mbar.

If the 1-of-5 control signal indicates that the partial product should be zero (Z), then the Pbar node is discharged through path 822 and node P is not discharged.

If the 1-of-5 control signal indicated that the partial product should be M (M), then depending on the value of M, either node P is discharged through path 810 (M= =1), or node Pbar is discharged through path 812 (Mbar = =1). Thus this bit of P will be equal to M.

If the 1-of-5 control signal indicates that the partial product should be −M (−M), then depending on the value of M, either node P is discharged through path 816 (Mbar = =1), or node Pbar is discharged through path 818 (M= =1). Thus this bit of P will be equal to the inversion of M. Note that to get −M (in two's complement form), we must add 1 into this partial product.

If the 1-of-5 control signal indicates that the partial product should be 2M (2M), then depending on the value of 2M, either node P is discharged through path 814a (2M= =1), or node Pbar is discharged through path 814b (2Mbar= =1). This sets this bit of the partial product to the bit of the multiplicand of one less significance, and represents shifting the multiplicand left by 1bit-position to obtain 2M.

If the 1-of-5 control signal indicates that the partial product should be −2M (−2M), then depending on the value of 2M, either node Pbar is discharged through path 820a (2M= =1), or node P is discharged through path 820b (2Mbar= =1). This sets this bit of the partial product to the inverse of the bit of the multiplicand of one less significance, and represents shifting the multiplicand left by 1bit-position to obtain 2M, and then inverting to obtain −2M.

Referring now to FIG. 7, the Booth multiplexer cell 108b according to the third type receives the sign bit of the multiplicand as a 1-of-2 signal from the translation buffer (FIG. 2). The wires of the this 1-of-2 signal are represented as "M" and "Mbar" in FIG. 7 and used to gate transistors 128c–134c. However, bit-shifting is irrelevant in this case, and is not performed in the Booth multiplexer cell 108c according to the third type.

The multiplier of the exemplary embodiment of the present invention includes seventeen Booth multiplexers, producing seventeen partial products. Each of the partial products is shifted by a predetermined number of bits to the left with respect to the previous partial products, and then the partial products are added. As described below with reference to the Wallace tree, the addition of the shifted partial products is performed upon columns of bits. Each partial product contributes one bit to each column. However, due to the shifting of the partial products, additional bits must be prepended to the previous partial products to provide bits for the more significant columns.

Sign extension prepends additional bits to the partial product produced by each Booth multiplexer cell. Sign extension ensures that the partial products shifted to the right of other partial products are nevertheless able to provide bits to the more significant columns in the Wallace tree. Sign extension is performed somewhat differently in the first Booth multiplexer than in the remaining multiplexers, since the first multiplexer has two additional Booth multiplexer cells of the third type (FIG. 8). The first partial product is sign extended two bits, as implemented in the Booth multiplexer cells 108c of the second type found in the first Booth multiplexer. With reference to the first Booth multiplexer, the additional Booth multiplexer cells 108c are Booth multiplexer cells 32–33.

Booth multiplexer cell 34 within the first Booth multiplexer, and Booth multiplexer cell 33 within the Booth multiplexers other than the first Booth multiplexer, are of the third type of Booth multiplexer cells mentioned above.

Thus, bits 0–31 of each partial product (and bit 32 if bit-shifting is performed) correspond to the multiplicand. Bit 32 of other than the first partial product will be inverted relative to bit 31, and bit 33 will be set to a value of 1. Bits 32 and 33 of the first partial product are identical to bit 31. Bit 34 of the first partial product will be inverted relative to bits 33–32.

The Wallace Tree

Figure 9A:
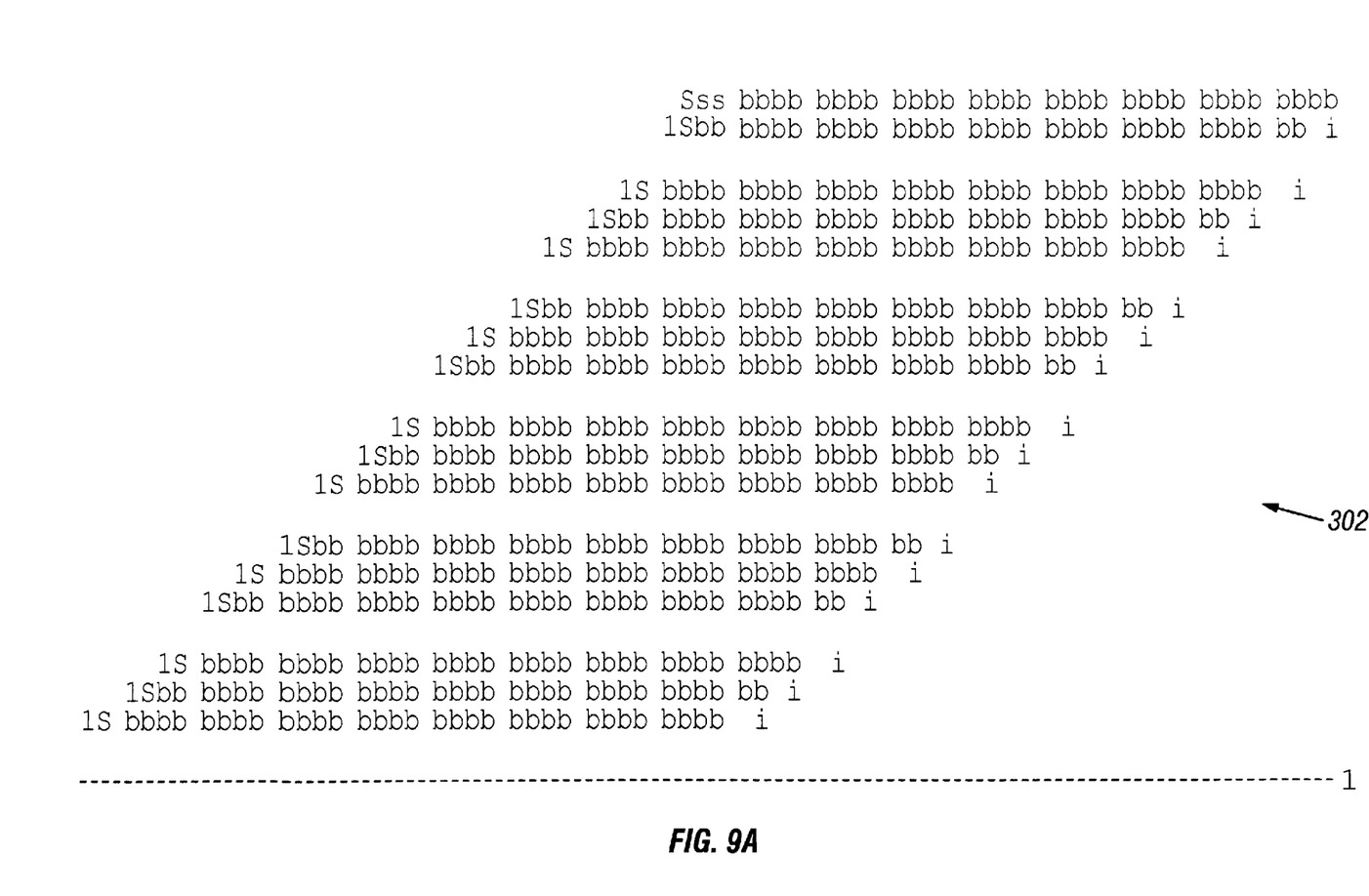
FIG. 9 shows a Wallace Tree of Carry-Save-Adders according to the exemplary embodiment of the present invention.
Figure 9B:
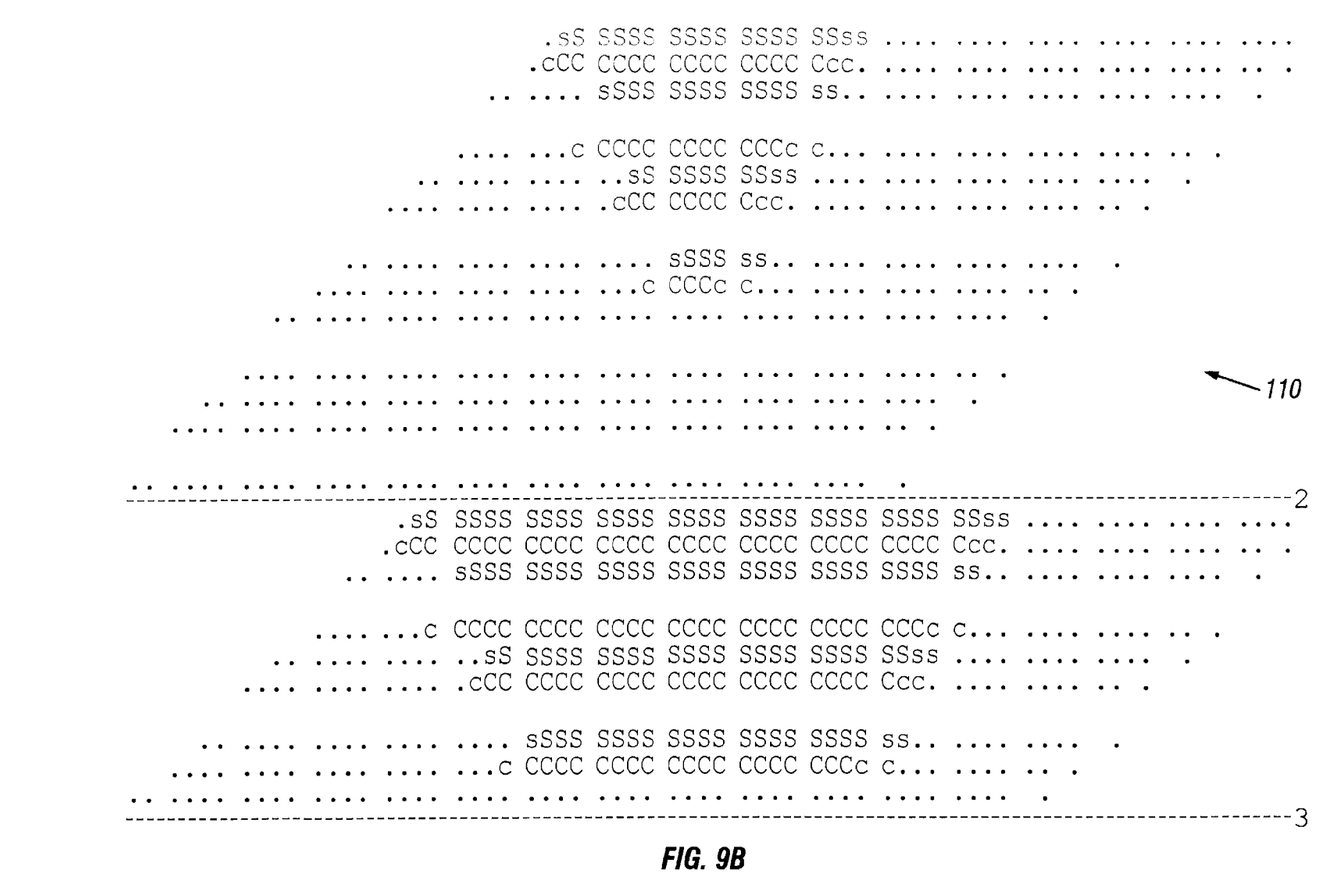
Figure 9C:
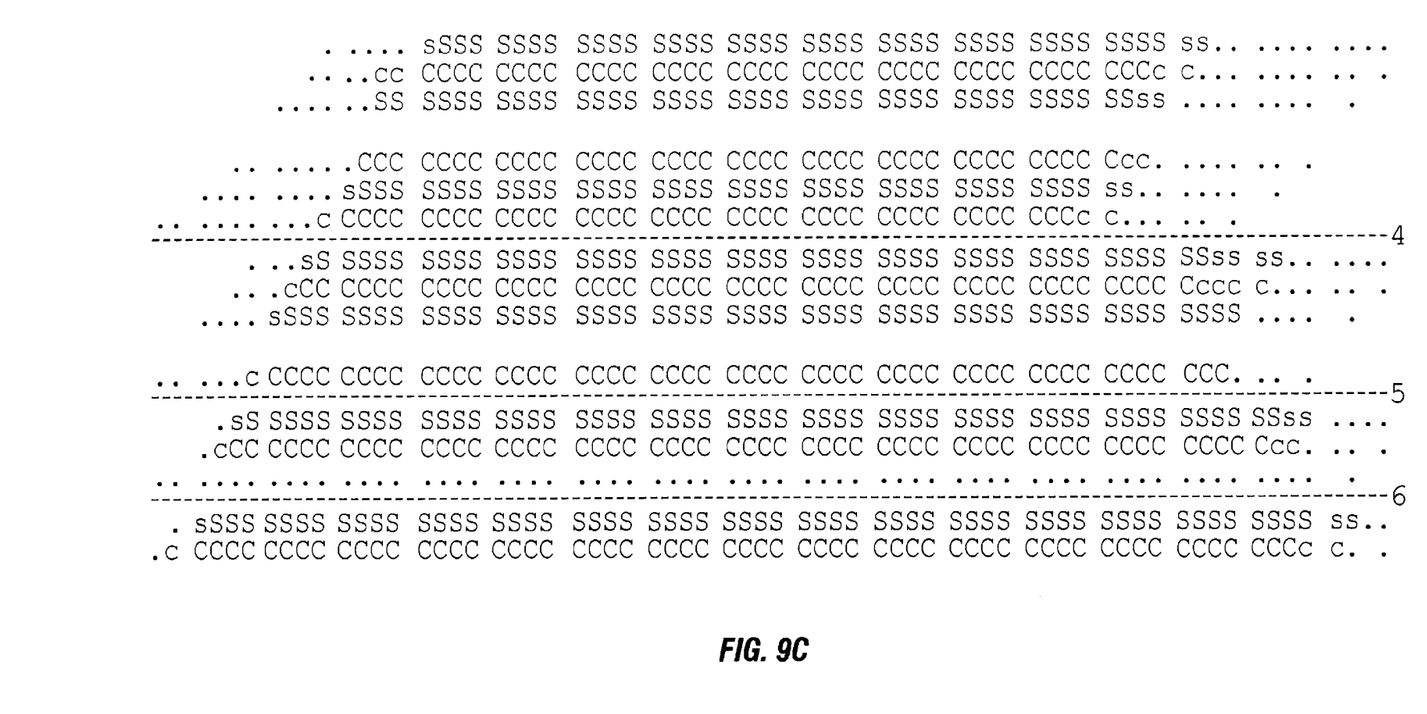

Referring now to FIG. 9, a Wallace tree includes six levels of Carry-Save-Adders (CSA's). Each level of the Wallace tree includes a number of CSA's, but most levels also include buffers that merely pass data from a previous level to a subsequent level.

The partial products generated by the Booth multiplexers are shown, after sign extension, in a zeroth level 302 of the Wallace tree. The various partial products are each shifted with respect to previous partial products, forming a parallelogram of bits. The parallelogram of bits contains columns and rows of bits. In the zeroth level 302, the lower case s's in the first partial product represent the two sign-extended bits and the upper case S in the first partial product represents the inverted sign bit. The lower case s and logical 1 shown in each remaining partial product reflect the sign extension operation discussed above.

It will be recalled from the above discussion of the negation of binary numbers, provided above with reference to the Booth multiplexer sub-operation of Booth multiplexer signing that the negation of binary numbers is generally accomplished by two's-complementing. The two's complement of a number may be found by finding the one's complement, and then arithmetically adding 1b. The one's-complement was accomplished in FIGS. 6–8 by reversing the data rails for 1-of-5 signals representing −M and −2M. However, in the above-discussion, the final addition of 1b was omitted.

Reference was made, in the discussion of FIG. 6, to an additional bit referred to as an "i" bit for each Booth multiplexer cell that is set when a twos-complement is needed, indicating a need subsequently to add 1b to the resulting value in order to accomplish negation. The "i" bit for each partial product is shown in the parallelogram 302 of the Wallace tree 110, below and aligned with the LSB of its respective partial product. The "i" bit that aligns with the LSB of partial products that equal 0, M (the multiplicand) or 2M (2× the multiplicand), as selected by the 0, +M, or +2M inputs to the relevant Booth multiplexer, are set to zero. The "i" bits that align with the LSB of partial products that are the inversion of M and 2M, selected by a −M or −2M input to the relevant Booth multiplexer, with be set to 1. While forming the two's complement for −M or −2M partial products is expensive as a standalone operation, it is easily embedded into the Wallace tree by utilizing the identity that two's complement is equal to one's complement plus one. As explained above, the Booth multiplexer generates the one's complement for negated operands, and the Booth encoder generates a signal that sets the "i" bit and is asserted when a negated operand is selected. This signal effects the "plus one" portion of the two's complement when the "i" bit is inserted into the Wallace tree aligned with the least significant bit of the one's complemented partial product, as shown in FIG. 9. The Wallace tree then adds all the partial products and "i" bits, internally forming two's complement quantities where appropriate.

Each row in the parallelogram corresponds to a partial product, and consequently there are 17 rows. It will be recalled that the number of partial products depends on the number of bits in the multiplier and the radix of the Booth algorithm. For a multiplier having 32 bits that is selectively sign/zero-extended to support signed/unsigned multiplication, 17 partial products are generated using the radix-four Booth algorithm. The number of columns in the parallelogram is n+m, where n is the number of bits in the multiplicand, and m is the number of bits in the multiplier (prior to any sign/zero extension for the purpose of supporting signed/unsigned multiplication). Each column contains at least one bit.

The first level of the Wallace tree considers each column of bits independently. Certain columns contain far more bits than other columns. Generally, the columns near the center of the parallelogram contain more bits than the columns near the left and right sides of the parallelogram.

Each level of a Wallace tree has a predetermined maximum column height. The sequence of such heights was empirically observed by L. Dadda, "Some Schemes for Parallel Multipliers," *Computer Arithmetic,* vol. 1, ed. Earl E. Swartzlander, Jr. IEEE Press, 1990. Columns having more bits than the predetermined maximum column height are collapsed using CSA's. The number of CSA's per level depends on a number of factors, but the CSA's are generally implemented where the columns have a large number of bits.

As shown in FIG. 9, the first level of the Wallace tree contains a number of full- and half-CSA's. Each CSA receives either two or three bits in a single column, and produces two bits (a sum bit and a carry bit) in adjacent columns. In other words, each CSA "consumes" two or three bits in a column, produces a sum bit in the column, and produces a carry bit in the next more significant column. The CSA therefore "flattens" the matrix of bits.

There are two flavors of CSA's. Half-CSA's consume two bits in a column, and produce one bit in each of two columns. Full-CSA's consume three bits in a column, and produce one bit in each of two columns. Half-CSA's are advantageous in that they use only half as many transistors as full-CSA's, but consume one fewer bits. In FIG. 9, the lower case s's and c's in the six Wallace tree levels represent the sum and carry bits produced by a half-CSA. Upper case S's and C's represent the sum and carry bits produced by full-CSA's.

The first level of the Wallace tree implements only so many CSA's as are necessary to bring the number of bits in each column down to no more than 13, the predetermined maximum column height for the first level. Columns that contain fewer bits than the predetermined maximum column height are merely buffered on to the second level. As shown in FIG. 9, several columns contain 17 bits in the zeroth level, and so four full-CSA's are used in each of these columns to reduce the number of bits in these columns to 13.

Half CSA's are used where they would result in achieving the maximum column height for that level, and a full CSA would reduce below that height. For example, in FIG. 9, half-CSA's are used in the first level of the Wallace tree where the column of bits at the zeroth level was originally 13 bits high, but a Carry bit has been added to the column by a full-CSA used in the adjacent column. Also, in certain columns, both full- and half-CSA's are used to achieve a column height of 13 bits at the first level.

The second level of the Wallace tree implements only so many full- and half-CSA's as are necessary to bring the number of bits in each column down to no more than 9, the predetermined maximum column height for the second level. Columns that contain fewer bits than the predetermined maximum column height are merely buffered on to the third level. As shown in FIG. 9, several columns contain 13 bits in the first level, and so four full-CSA's are used in each of these columns. Columns that contain less than 13 bits, but more than 9 bits (including the carry bit from a CSA in an adjacent column, if applicable) use one or more half-CSA's. Some columns use both one or more full-CSA's and one or more half-CSA's to achieve a column height of 9 bits.

The third level of the Wallace tree implements only so many CSA's as are necessary to bring the number of bits in each column down to no more than 6, the predetermined maximum column height for the third level. Columns that contain fewer bits than the predetermined maximum column height are merely buffered on to the fourth level. As shown in FIG. 9, several columns contain 9 bits in the second level, and so three full-CSA's are used in each of these columns.

The fourth level of the Wallace tree implements only so many CSA's as are necessary to bring the number of bits in each column down to no more than 4, the predetermined maximum column height for the fourth level. Columns that contain fewer bits than the predetermined maximum column height are merely buffered on to the fifth level. As shown in FIG. 9, several columns contain 6 bits in the third level, and so two full-CSA's are used in each of these columns.

The fifth level of the Wallace tree implements only so many CSA's as are necessary to bring the number of bits in each column down to no more than 3, the predetermined maximum column height for the fifth level. Columns that contain fewer bits than the predetermined maximum column height are merely buffered on to the sixth level. As shown in FIG. 9, several columns contain 4 bits in the fourth level, and so one full-CSA is used in each of these columns.

The sixth (and final) level of the Wallace tree implements only so many CSA's as are necessary to bring the number of bits in each column down to no more than 2, the predetermined maximum column height for the sixth level. As shown in FIG. 9, several columns contain 3 bits in the fifth level, and so one full-CSA is used in each of these columns. Each full-CSA reduces the column height by two bits, by consuming three bits in the column and producing one bit in each of two columns.

Figure 10:
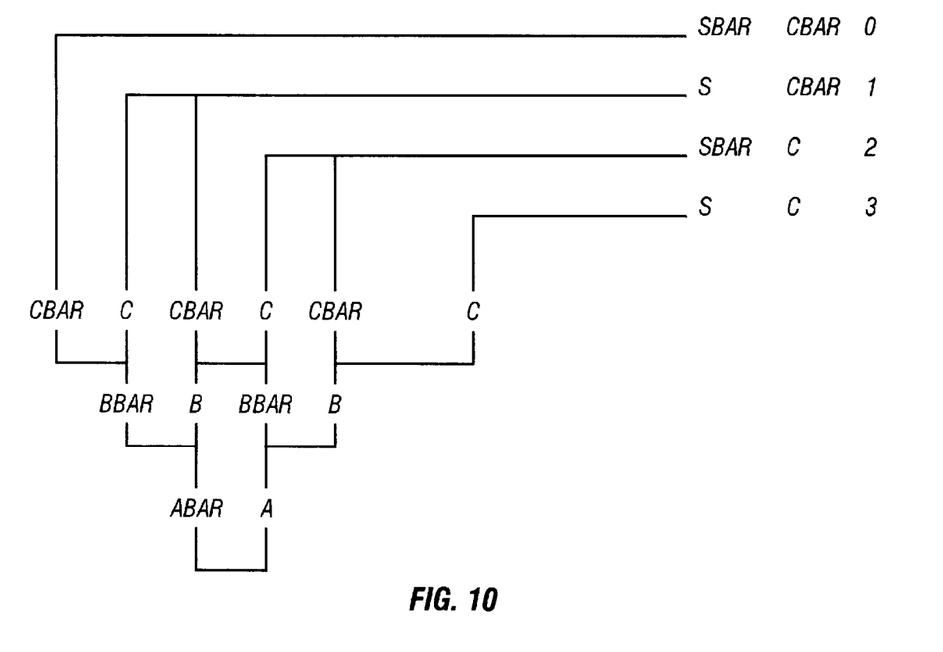
FIG. 10 shows a full carry-save-adder (CSA).
Figure 11:
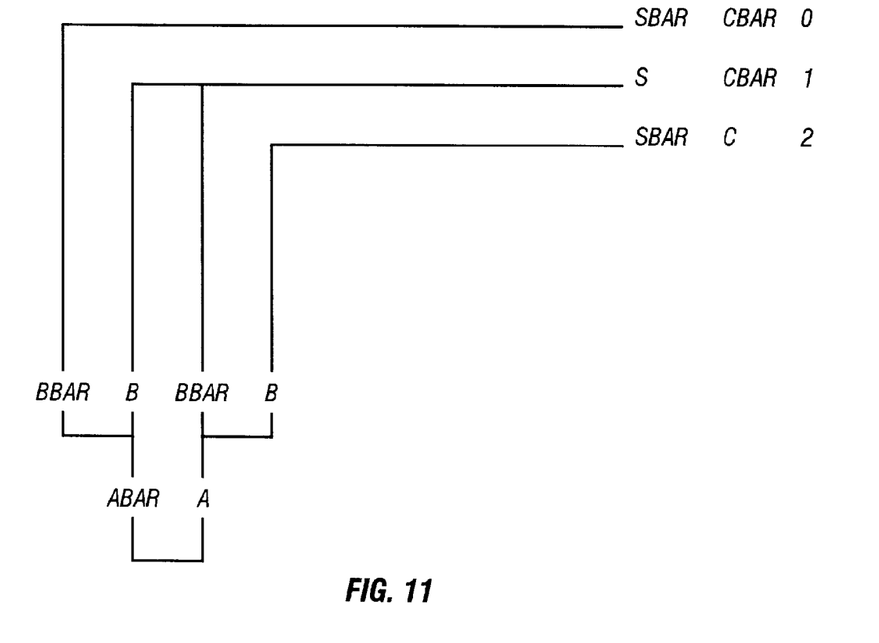
FIG. 11 shows a half carry-save-adder (CSA).

The CSA logic is shown in FIGS. 10 and 11. The full CSA (FIG. 10) takes three 1-of-2 inputs A, B, and C, and produces 1-of-2 sum and carry signals S and C, representing the simple sum of the three inputs. The half CSA (FIG. 11) takes only two 1-of-2 inputs A and B; it correspondingly has one fewer output case, since the case of both sum and carry asserted cannot occur.

The final level of CSA optionally produces a 1-of-4 or other N-NARY encoded output, rather than discrete sum and carry signals; the structure of the gates are exactly the same, but the output sections are simpler (since it is not necessary to NAND multiple nodes into a single output signal). This CSA level feeds a 64-bit carry lookahead adder not shown here. With a four-level 64-bit adder, six levels of CSA, and two levels of Booth encoding and multiplexing, the total number of logic levels required is twelve.

Other embodiments of the invention will be apparent to those skilled in the art after considering this specification or practicing the disclosed invention. The specification and examples above are exemplary only, with the true scope of the invention being indicated by the following claims.

What is claimed is:

1. An apparatus that provides the product of a multiplicand and a multiplier, comprising:

an encoder circuit that performs a Booth recoding, said encoder circuit further comprises a plurality of N-NARY logic cells, each N-NARY logic cell receives an individual 1-of-N signal where N=4 that represents the value of one dit of the multiplier, each N-NARY logic cell produces an output 1-of-N signal;

a translation buffer that converts each dit of the multiplicand into a bit pair represented by two 1-of-N signals where N=2, said translation buffer receives a plurality of 1-of-N signals where N=4 and outputs a plurality of 1-of-N signals where N=2;

a plurality of multiplexers that produce a plurality of partial products, wherein each multiplexer receives said plurality of 1-of-N signals where N=2 and an output 1-of-N signal produced by a said encoder circuit N-NARY logic cell and produces one partial product; and an output structure comprising a Wallace tree and a final adder, said Wallace tree comprises a plurality of carry-save-adders that sum said plurality of partial products to produce two intermediate partial products, said final adder sums said two intermediate partial products to produce a final product.

2. The apparatus of claim 1 wherein said encoder circuit performs a radix-4 Booth recoding of the multiplier.

3. The apparatus of claim 1 wherein each said N-NARY logic cell further comprises one of the following two types of N-NARY logic cells: a logic cell that recodes the least significant dit of the multiplier, or a logic cell that recodes the remaining dits of the multiplier.

4. The apparatus of claim 3 wherein said logic cell that recodes the remaining dits of the multiplier receives two input 1-of-N signals where N=4 that represent the values of adjacent dits of the multiplier.

5. The apparatus of claim 3 wherein said output 1-of-N signal of said logic cell that recodes the least significant dit of the multiplier further comprises a 1-of-N signal where N=4.

6. The apparatus of claim 1 wherein said enoder circuit further comprises a dit prepending-and-recoding N-NARY logic cell, said dit prepending-and-recoding N-NARY logic cell receives an input 1-of-N signal where N=4 that represents the value of the most significant dit of the multiplier, and an input 1-of-N signal where N=2 that indicates whether the multiplier is signed or unsigned, and said output 1-of-N signal has a first value when either the multiplier is signed or the multiplier is unsigned and its most significant dit has a value of 0 or 1, and a second value when the multiplier is unsigned and the value of its most significant dit is 2 or 3.

7. A multiplier system that provides the product of a multiplicand and a multiplier, comprising:

an encoder circuit that performs a Booth recoding, said encoder circuit further comprises a plurality of N-NARY logic cells, each N-NARY logic cell receives an individual 1-of-N signal where N=4 that represents the value of one dit of the multiplier, each N-NARY logic cell produces an output 1-of-N signal;

a translation buffer that converts each dit of the multiplicand into a bit pair represented by two 1-of-N signals where N=2, said translation buffer receives a plurality of 1-of-N signals where N=4 and outputs a plurality of 1-of-N signals where N=2;

a plurality of multiplexers that produce a plurality of partial products, wherein each multiplexer receives said plurality of 1-of-N signals where N=2 and an output 1-of-N signal produced by a said encoder circuit N-NARY logic cell and produces one partial product; and an output structure comprising a Wallace tree and a final adder, said Wallace tree comprises a plurality of carry-save-adders that sum said plurality of partial products to produce two intermediate partial products, said final adder sums said two intermediate partial products to produce a final product.

8. The multiplier system of claim 7 wherein said encoder circuit performs a radix-4 Booth recoding of the multiplier.

9. The multiplier system of claim 7 wherein each said N-NARY logic cell further comprises one of the following two types of N-NARY logic cells: a logic cell that recodes the least significant dit of the multiplier, or a logic cell that recodes the remaining dits of the multiplier.

10. The multiplier system of claim 9 wherein said logic cell that recodes the remaining dits of the multiplier receives two input 1-of-N signals where N=4 that represent the values of adjacent dits of the multiplier.

11. The multiplier system of claim 9 wherein said output 1-of-N signal of said logic cell that recodes the least significant dit of the multiplier further comprises an output 3 1-of-N signal where N=4.

12. The multiplier system of claim 7 wherein said encoder circuit further comprises a dit prepending-and-recoding N-NARY logic cell, said dit prepending-and-recoding N-NARY logic cell receives an input 1-of-N signal where N=4 that represents the value of the most significant dit of the multiplier, and an input 1-of-N signal where N=2 that indicates whether the multiplier is signed or unsigned, and said output 1-of-N signal has a first value when either the multiplier is signed or the multiplier is unsigned and its most significant dit has a value of 0 or 1, and a second value when the multiplier is unsigned and the value of its most significant dit is 2 or 3.

13. A method that makes an apparatus that provides the product of a multiplicand and a multiplier, comprising:

providing a encoder circuit that performs a Booth recoding,said encoder circuit further comprises a plurality of N-NARY logic cells, each N-NARY logic cell receives an individual 1-of-N signal where N=4 that represents the value of one dit of the multiplier, each N-NARY logic cell produces an output 1-of-N signal;

providing a translation buffer that converts each dit of the multiplicand into a bit pair represented by two 1-of-N signals where N=2, said translation buffer receives a plurality of 1-of-N signals where N=4 and outputs a plurality of 1-of-N signals where N=2;

providing a plurality of multiplexers that produce a plurality of partial products, wherein each multiplexer receives said plurality of 1-of-N signals where N=2 and an output 1-of-N signal produced by one said encoder circuit N-NARY logic cell and produces one partial product; and providing an output structure comprising a Wallace tree and a final adder, said Wallace tree comprises a plurality of carry-save-adders that sum said plurality of partial products to produce two intermediate partial products, said final adder sums said two intermediate partial products to produce a final product.

14. The method of claim 13 wherein said encoder circuit performs a radix-4 Booth recoding of the multiplier.

15. The method of claim 13 wherein each said N-NARY logic cell further comprises one of the following two types of N-NARY logic cells: a logic cell that recodes the least significant dit of the multiplier, or a logic cell that recodes the remaining dits of the multiplier.

16. The method of claim 15 wherein said logic cell that recodes the remaining dits of the multiplier receives two input 1-of-N signals where N=4 that represent the values of adjacent dits of the multiplier.

17. The method of claim 15 wherein said output 1-of-N signal of said logic cell that recodes the least significant dit of the multiplier further comprises a 1-of-N signal where N=4.

18. The method of claim 13, further comprising providing a dit prepending-and-recoding N-NARY logic cell, said dit prepending-and-recoding N-NARY logic cell receives an input 1-of-N signal where N=4 that represents the value of the most significant dit of the multiplier, and an input 1-of-N signal where N=2 that indicates whether the multiplier is signed or unsigned, and said output 1-of-N signal has a first value when either the multiplier is signed or the multiplier is unsigned and its most significant dit has a value of 0 or 1 and a second value when the multiplier is unsigned and the value of its most significant dit is 2 or 3.

19. A method that determines the product of a multiplicand and a multiplier, comprising:

performing a Booth recoding of the multiplier using an encoder circuit, said encoder circuit further comprises a plurality of N-NARY logic cells, each N-NARY logic cell receives an individual 1-of-N signal where N=4 that represents the value of one dit of the multiplier, each N-NARY logic cell produces an output 1-of-N signal;

converting each dit of the multiplicand into a bit pair represented by two 1-of-N signals where N=2,using a translation buffer that receives a plurality of 1-of-N signals where N=4 and outputs a plurality of 1-of-N signals where N=2;

producing a plurality of partial products using a plurality of multiplexers wherein each multiplexer receives said plurality of 1-of-N signals where N=2 and an output 1-of-N signal produced by one said encoder circuit N-NARY logic cell and produces one partial product;

producing two intermediate partial products by summing said plurality of partial products using a Wallace tree that comprises a plurality of carry-save-adders; and summing said two intermediate partial products to produce a final product.

20. The method of claim 19 wherein said encoder circuit performs a radix-4 Booth recoding of the multiplier.

21. The method of claim 19 wherein each said N-NARY logic cell further comprises one of the following two types of N-NARY logic cells: a logic cell that recodes the least significant dit of the multiplier, or a logic cell that recodes the remaining dits of the multiplier.

22. The method of claim 21 wherein said logic cell that recodes the remaining dits of the multiplier receives two input 1-of-N signals where N=4 that represent the values of adjacent dits of the multiplier.

23. The method of claim 21 wherein said N-NARY output signal of said logic cell that recodes the least significant dit of the multiplier further comprises a 1-of-N signal where N=4.

24. The method of claim 19, further comprising sign- or zero extending the multiplier using a prepending-and-recoding N-NARY logic cell, said dit prepending-and-recoding N-NARY logic cell receives an input 1-of-N signal where N=4 that represents the value of the most significant dit of the multiplier, and an input 1-of-N signal where N=2 that indicates whether the multiplier is signed or unsigned, and said output 1-of-N signal has a first value when either the multiplier is signed or the multiplier is unsigned and its most significant dit has a value of 0 or 1 and a second value when the multiplier is unsigned and the value of its most significant dit is 2 or 3.

* * * * *